(12) United States Patent
Heppner et al.

(10) Patent No.: US 9,491,881 B2
(45) Date of Patent: Nov. 8, 2016

(54) MICROELECTRONIC SOCKET COMPRISING A SUBSTRATE AND AN INSULATIVE INSERT MATED WITH OPENINGS IN THE SUBSTRATE

(71) Applicants: Joshua D. Heppner, Chandler, AZ (US); Zhichao Zhang, Chandler, AZ (US); Srikant Nekkanty, Chandler, AZ (US); Michael Garcia, Chandler, AZ (US)

(72) Inventors: Joshua D. Heppner, Chandler, AZ (US); Zhichao Zhang, Chandler, AZ (US); Srikant Nekkanty, Chandler, AZ (US); Michael Garcia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 197 days.

(21) Appl. No.: 14/164,403

(22) Filed: Jan. 27, 2014

(65) Prior Publication Data

US 2015/0214665 A1 Jul. 30, 2015

(51) Int. Cl.
*H05K 7/10* (2006.01)
*H01R 12/70* (2011.01)
*H05K 1/18* (2006.01)
*H05K 3/42* (2006.01)

(52) U.S. Cl.
CPC ......... *H05K 7/1069* (2013.01); *H01R 12/7076* (2013.01); *H01R 12/7082* (2013.01); *H05K 1/184* (2013.01); *H05K 3/42* (2013.01); *H05K 2201/09545* (2013.01); *H05K 2201/10189* (2013.01); *H05K 2201/10265* (2013.01); *Y10T 29/49222* (2015.01)

(58) Field of Classification Search
CPC ............ H01R 13/6471; H01R 12/716; H01L 2225/06537; H01L 2225/5225
See application file for complete search history.

(56) References Cited

U.S. PATENT DOCUMENTS

| 8,025,531 | B1* | 9/2011 | Zhang | ................... | H01R 12/52 439/607.05 |
| 2009/0236137 | A1* | 9/2009 | Kaneda | ................. | H05K 3/426 174/262 |

* cited by examiner

*Primary Examiner* — Thao X Le
*Assistant Examiner* — J. R. Oakley
(74) *Attorney, Agent, or Firm* — Winkle, PLLC (57) ABSTRACT

A microelectronic socket having a two piece construction, wherein a first piece comprises a conductive socket substrate and the second piece comprises an insulative insert. The conductive socket substrate has a first surface, a second surface, and at least one opening extending therebetween. The insulative insert has a base portion with at least one projection extending therefrom. The insulative insert is mated with the conductive socket substrate such that the at least one projection resides within a corresponding conductive socket substrate opening. The insulative insert further includes a plurality of vias, wherein at least one of the plurality of vias extends through the insulative base and through an insulative insert projection, wherein a contact may be disposed within the via.

18 Claims, 10 Drawing Sheets

MICROELECTRONIC SOCKET COMPRISING A SUBSTRATE AND AN INSULATIVE INSERT MATED WITH OPENINGS IN THE SUBSTRATE

TECHNICAL FIELD

Embodiments of the present description generally relate to the field of microelectronic device fabrication, and, more particularly, to forming a microelectronic socket for removably attaching a microelectronic device to a microelectronic substrate, wherein the microelectronic socket includes a two piece structure comprising a conductive socket substrate and an insulative insert which electrically isolates at least one contact from the conductive socket substrate, through which it extends.

BACKGROUND

The microelectronic industry is continually striving to produce ever faster and smaller microelectronic packages for use in various electronic products, including, but not limited to, computer server products and portable product, such as portable computers, electronic tablets, cellular phones, digital cameras, and the like. These microelectronic packages may include a microprocessor, a chipset, a graphics device, a wireless device, a memory device, an application specific integrated circuit, and/or the like, and may be attached to a microelectronic substrate through a microelectronic socket mounted to the microelectronic substrate. However, as microelectronic packages become smaller with tighter pitches between signal lines, it becomes more difficult to reduce the size of the microelectronic sockets without inducing signal loss due to cross-talk between adjacent contacts extending through the microelectronic sockets. One method to enable low signal loss is to add ground contacts extending through the microelectronic sockets to act as shielding structures; however, this undesirably increases the microelectronic socket footprint/size. Another method to enable low signal loss is to fabricate a shielded microelectronic socket, which has grounded shielding structures therein. However, shielded microelectronic sockets are generally difficult to fabricate, as non-traditional material processes may be necessary in order to integrate shielding and insulation into the ever tight pitches between the contacts extending through the microelectronic sockets. Therefore, there is a need to fabricate shielded microelectronic sockets in an effective and cost effective manner.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description include a microelectronic socket having a two piece construction, wherein a first piece comprises a conductive socket substrate and the second piece comprises an insulative insert. The conductive socket substrate may have a first surface, a second surface, and at least one opening extending therebetween. The insulative insert may have a base portion with at least one projection extending therefrom. The insulative insert may be mated with the conductive socket substrate such that the at least one projection resides within a corresponding conductive socket substrate opening. The insulative insert may further include a plurality of vias, wherein at least one of the plurality of vias extends through the insulative insert base and through an insulative insert projection, wherein a contact may be disposed within the via.

Figure 1:
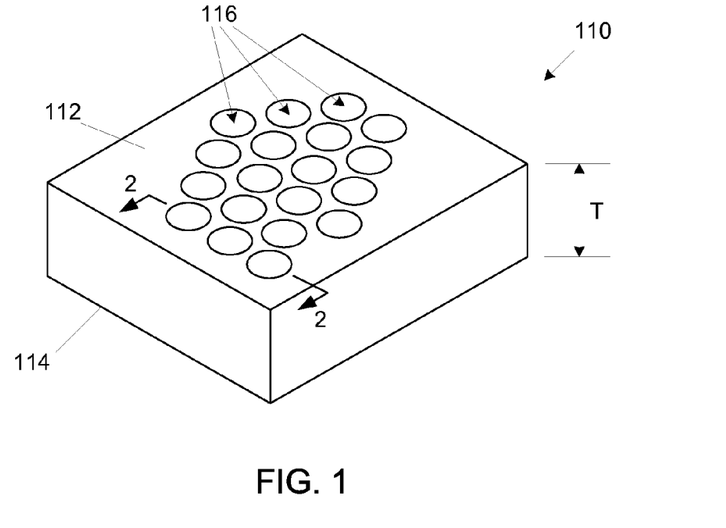
FIGS. 1-14 illustrate oblique and cross-sectional views of a method of forming a microelectronic socket, according to an embodiment of the present description.
Figure 2:
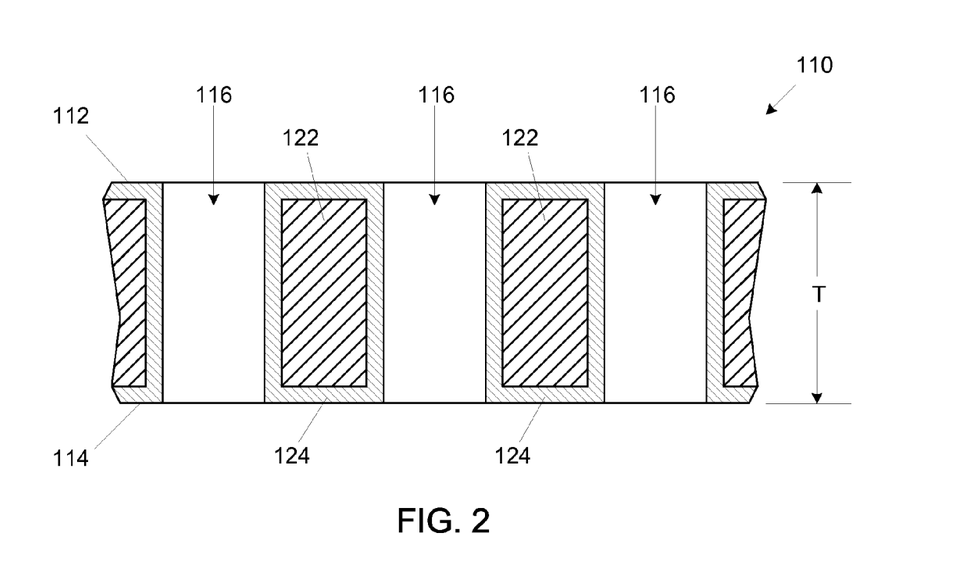

FIG. 1 illustrates a conductive socket substrate 110 having a first surface 112, an opposing second surface 114, a plurality of openings 116 extending from the conductive socket substrate first surface 112 to the conductive socket substrate second surface 114, and a thickness T defined between the conductive socket substrate first surface 112 and the conductive socket substrate second surface 114. The conductive socket substrate openings 116 may be formed by molding during the formation of the conductive socket substrate 110, or may be formed by drilling through the conductive socket substrate 110 by laser drilling, ion milling, and the like. As shown in FIG. 2 (cross-sectional view along line 2-2 of FIG. 1), the conductive socket substrate 110 may be formed from a substantially non-conductive material core 122, including, but not limited to, liquid crystal polymer, epoxy resin, bismaleimide triazine resin, FR4, polyimide materials, and the like, wherein its exterior surface may be plated with a conductive material 124, including, but not limited to, copper, silver, gold, nickel, and alloys thereof. It is understood that the conductive socket substrate 110 may be made entirely from a conductive material. Furthermore, although the conductive socket substrate 110 is illustrated with nineteen (19) conductive socket substrate openings 116 that are substantially cylindrical and in a stagger configuration, it is understood that the conductive socket substrate openings 116 may be of any appropriate number, shape, and/or configuration.

Figure 3:
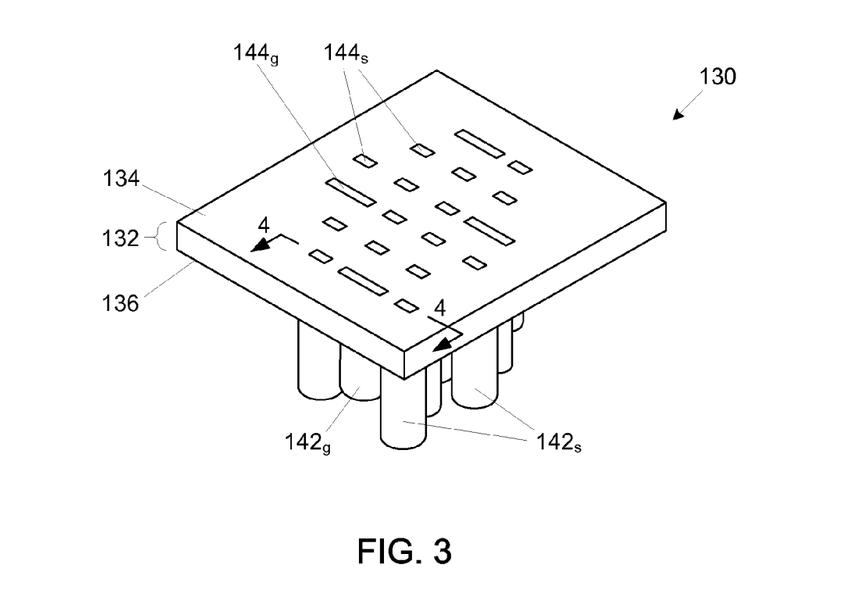
Figure 4:
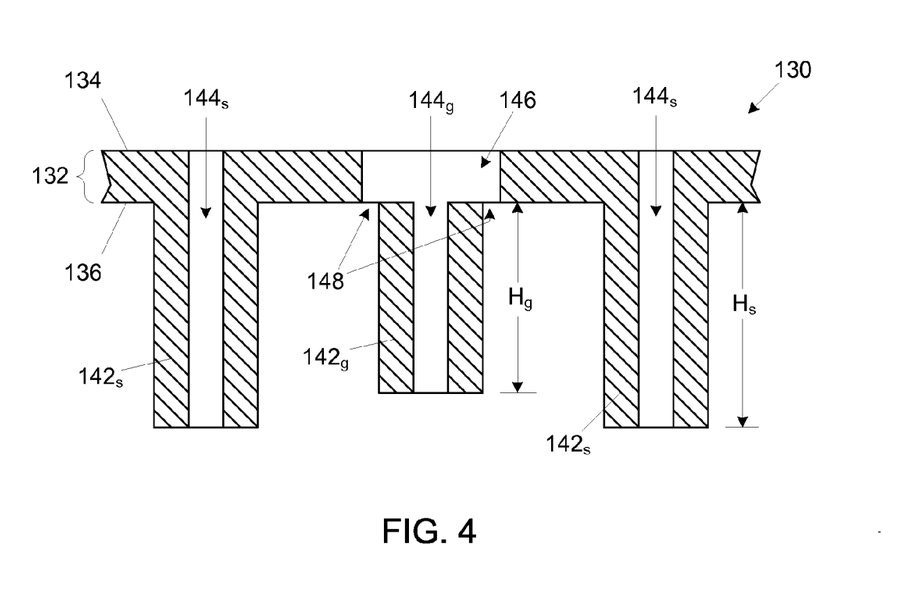

FIGS. 3 and 4 (cross-sectional view along line 4-4 of FIG. 3) illustrate an insulative insert 130 comprising a base portion 132, having a first surface 134, an opposing second surface 136, and a plurality of projections (elements $142_s$ and $142_g$) extending from the insulative insert base portion second surface 136. The subscript designation of "s" is used to designate structures that will be used for signal contacts and the subscript designation of "g" is used to designate structures that will be used for ground contacts, as will be discussed.

The insulative insert 130 may be made from any appropriate electrically insulative material, including but not limited to, liquid crystal polymer, polyetherimide resin, and polyaryletherketone resin. The insulative insert 130 may be made by any appropriate process including, but not limited to molding. The insulative insert projections $142_s$ and $142_g$ may be shaped to be inserted into the conductive socket substrate openings 116 illustrated in FIGS. 1 and 2. The insulative insert 130 may include a plurality of vias $144_s$ and $144_g$ extending from the insulative insert base portion first surface 134 through the insulative insert projections $142_s$ and $142_g$, respectively. In one embodiment, the insulative insert vias $144_g$, which will be used for ground contacts as will be discussed, may include a slotted portion 146, which results in at least one opening 148 between the slotted portion 146 and the insulative insert base portion second surface 136. In an embodiment, the height $H_g$ of insulative insert projections $142_g$ may be less than the height $H_s$ of insulative insert projections $142_s$, as will be subsequently discussed, and the height $H_s$ of the projections $142_s$ may be substantially equal to the conductive socket substrate thickness T.

Figure 5:
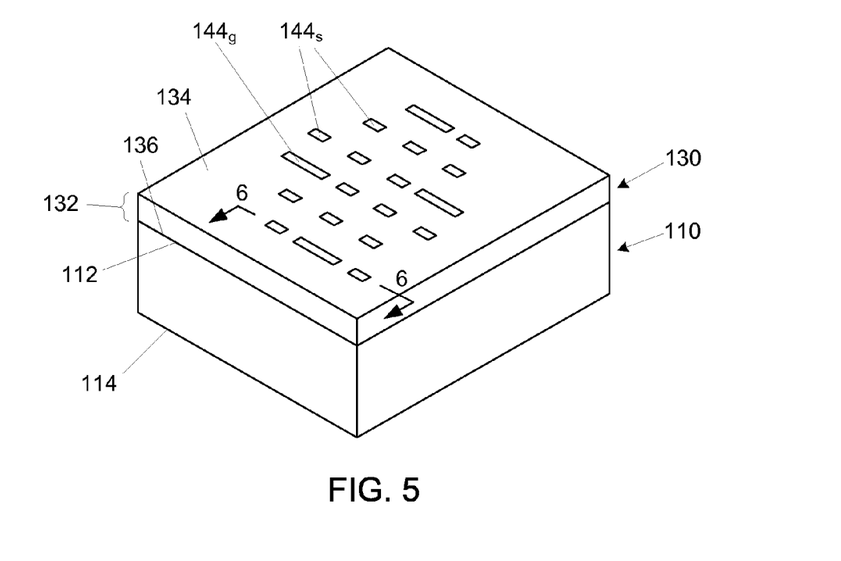
Figure 6:
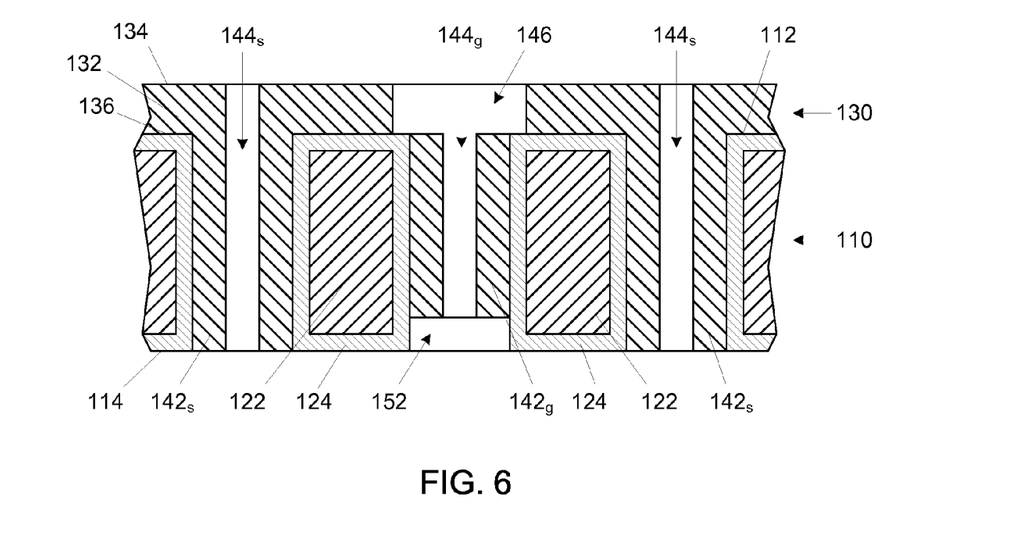

As illustrated in FIGS. 5 and 6 (cross-sectional view along line 6-6 of FIG. 5), the insulative insert 130 may be inserted into or otherwise mated with the conductive socket substrate 110, wherein the insulative insert projections $142_s$ and $142_g$ are inserted into corresponding conductive socket substrate openings 116 (see FIGS. 1 and 2), and the insulative insert base portion second surface 136 may contact the conductive socket substrate first surface 112. As previously discussed, the insulative insert projections $142_g$ may have a height $H_g$ (see FIG. 4) that is less than the conductive socket substrate thickness T (see FIG. 2), which may result in a ground contact recess 152 between the conductive socket substrate second surface 114 and the insulative insert projection $142_g$.

Figure 7:
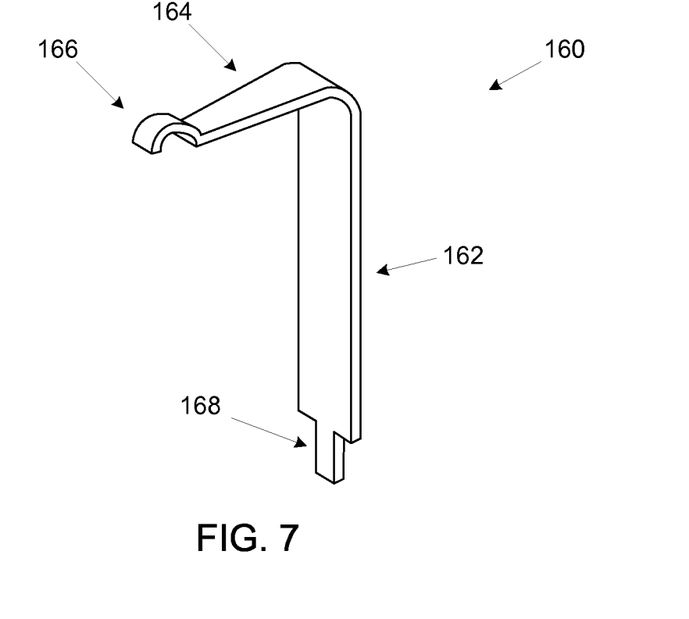

FIG. 7 illustrates a contact 160 having a body 162, an attachment extension 168 on one end of the contact body 162, and a spring cantilever portion 164 on an opposing end of the contact body 162. The contact spring cantilever portion 164 may have an arced device contact structure 166 on an end of the contact spring cantilever portion 164 opposing the contact body 162. The illustrated contact 160 is known in the art as a cantilever contact. The contact 160 may be made of any appropriate conductive material, such as a metal, including but not limited to, copper, aluminum, steel, phosphor bronze alloy, beryllium copper alloy, and the like. The contact 160 may be made by any process known in the art, including but not limited to stamping. It is understood that embodiments of the present description are not limited to cantilever contacts, but may include any appropriate contact structure.

Figure 8:
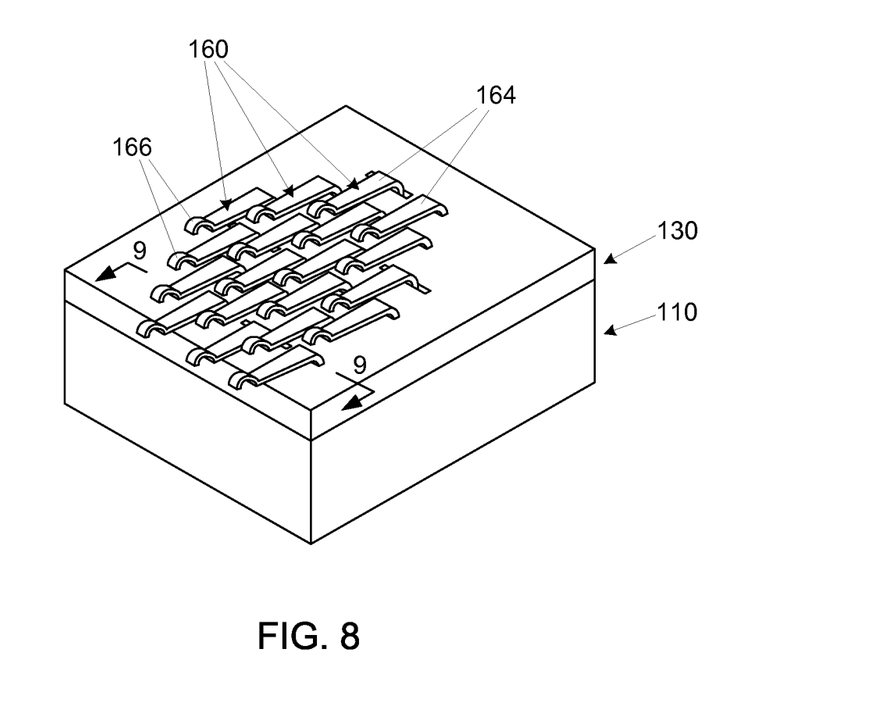
Figure 9:
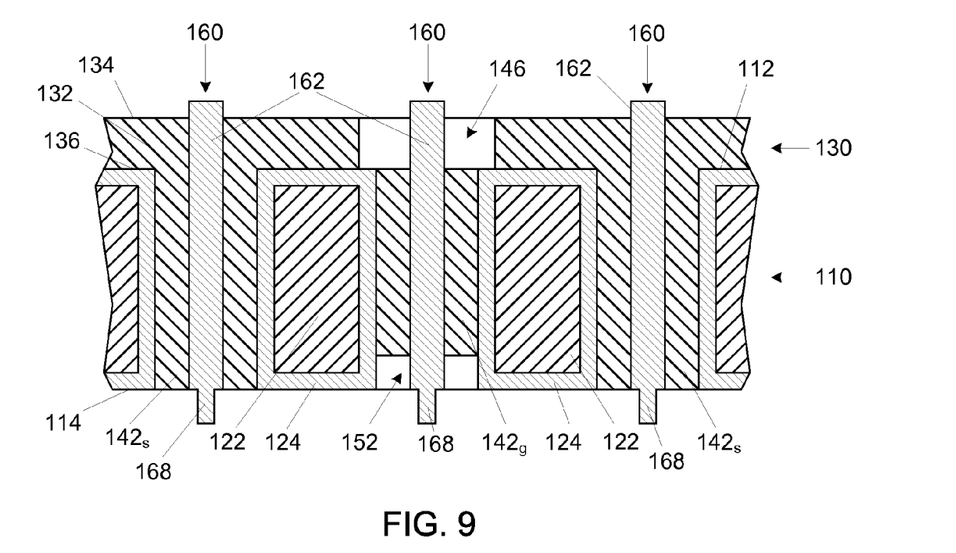

As shown in FIGS. 8 and 9 (cross-sectional view along line 9-9 of FIG. 8), the contacts 160 may be inserted into the insulative insert 130, such that the contact body 162 of each contact 160 resides within its respective insulative insert vias $144_s$, $144_g$ (see FIG. 9). As illustrated, the contact spring cantilever portion 164 may extend over the insulative insert base portion first surface 134 (see FIG. 8) and the contact attachment extension 168 may extend beyond the conductive socket substrate second surface 114 (see FIG. 9). It is understood that the insulative insert projections $142_s$ and $142_g$ electrically isolate the contacts 160 from the conductive socket substrate 110.

Figure 10:
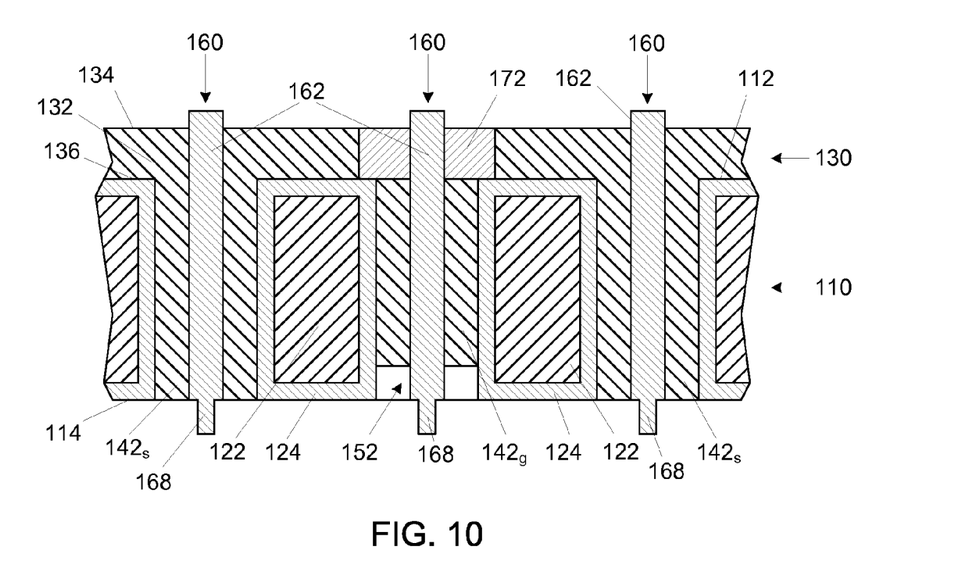

As shown in FIG. 10, a first conductive material 172 may be disposed in the insulative insert via slotted portion 146 (see FIG. 9) which may result in the contact 160 extending through the insulative insert projection $142_g$ being in electrical contact with the conductive socket substrate 110 through the openings 148 (as shown and discussed with regard to FIG. 4). As will be understood to those skilled in the art, this contact 160 will be a ground contact which may be place a ground potential on the entire conductive socket substrate 110 when it is connected to a microelectronic substrate, as will be discussed. The first conductive material 172 may be any appropriate conductive material, including but not limited to conductive epoxy, solder paste, conductive glue, metal filler paste, conductive paint, and the like.

Figure 11:
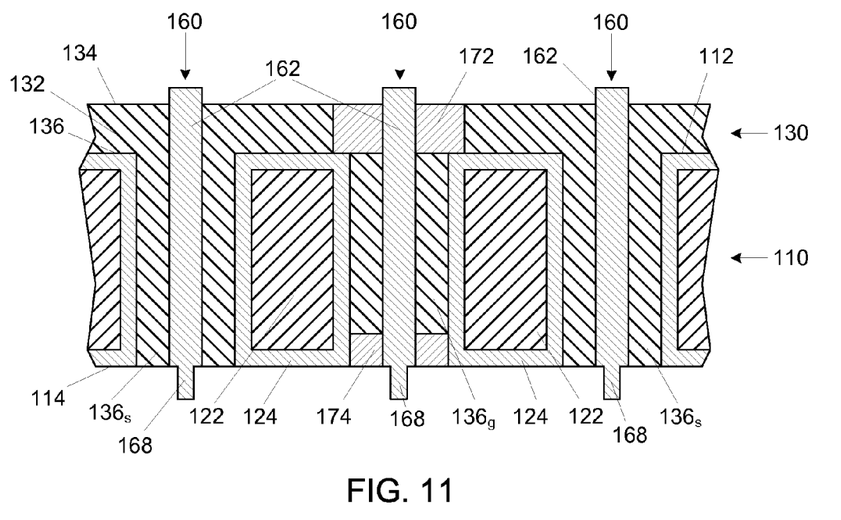

As shown in FIG. 11, a second conductive material 174 may be disposed in the ground contact recess 152 (see FIGS. 9 and 10) which may also result in the contact 160 extending through the insulative insert projection $142_g$ being in electrical contact with the conductive socket substrate 110. As previously discussed, this contact 160 will be a ground contact which may be place a ground potential on the entire conductive socket substrate 110 when it is connected to a microelectronic substrate, as will be discussed. The second conductive material 174 may be any appropriate conductive material, including but not limited to conductive epoxy, solder paste, conductive glue, metal filler paste, conductive paint, and the like.

Figure 12:
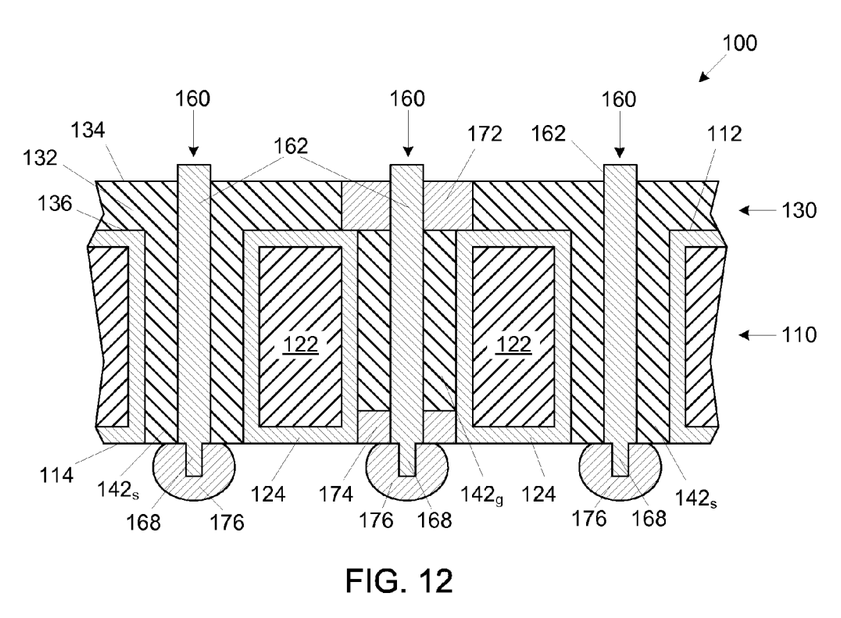

As shown in FIG. 12, an interconnect 176 may be formed on each contact 160 to form a microelectronic socket 100. The interconnect 176 may be made of any appropriate conductive material, such as a solder material, and may be made by any fabrication technique known in the art. In one embodiment, the attachment extension 168 may extend into the interconnect 176, as illustrated.

Figure 13:
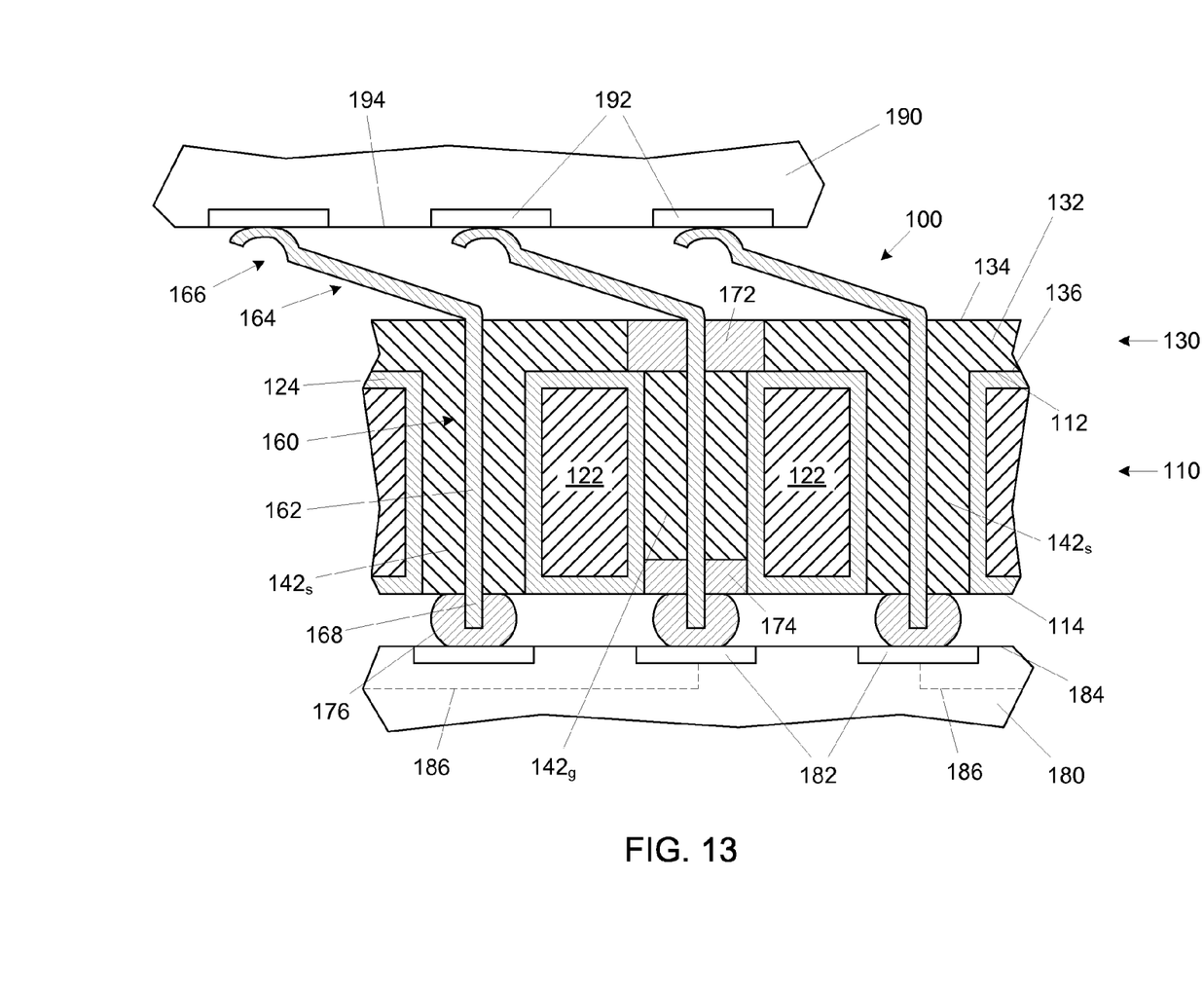

As shown in FIG. 13, the microelectronic socket 100 may be electrically attached to a microelectronic substrate 180 with the interconnects 176 attached to respectively bond pads 182 proximate a first surface 184 of the microelectronic substrate 180. The microelectronic substrate 180 may be any appropriate substrate, such as a motherboard, and may provide electrical communication routes (illustrated as dashed lines 186) between the microelectronic socket 100 and external components (not shown). A microelectronic device 190 may be biased by a biasing mechanism (not shown) against the microelectronic socket 100, such that bond pads 192 proximate a first surface 194 of the microelectronic device 190 contacts their respective arced device contact structures 166 of the contacts 160. As will be understood to those skilled in the art, the microelectronic device bond pads 192 are in electrical communication with integrated circuitry (not shown) within the microelectronic device 190. The microelectronic device 190 may be any appropriate microelectronic device, including, but not limited to a microprocessor, a chipset, a graphics device, a wireless device, a memory device, an application specific integrated circuit device, and the like.

Figure 14:
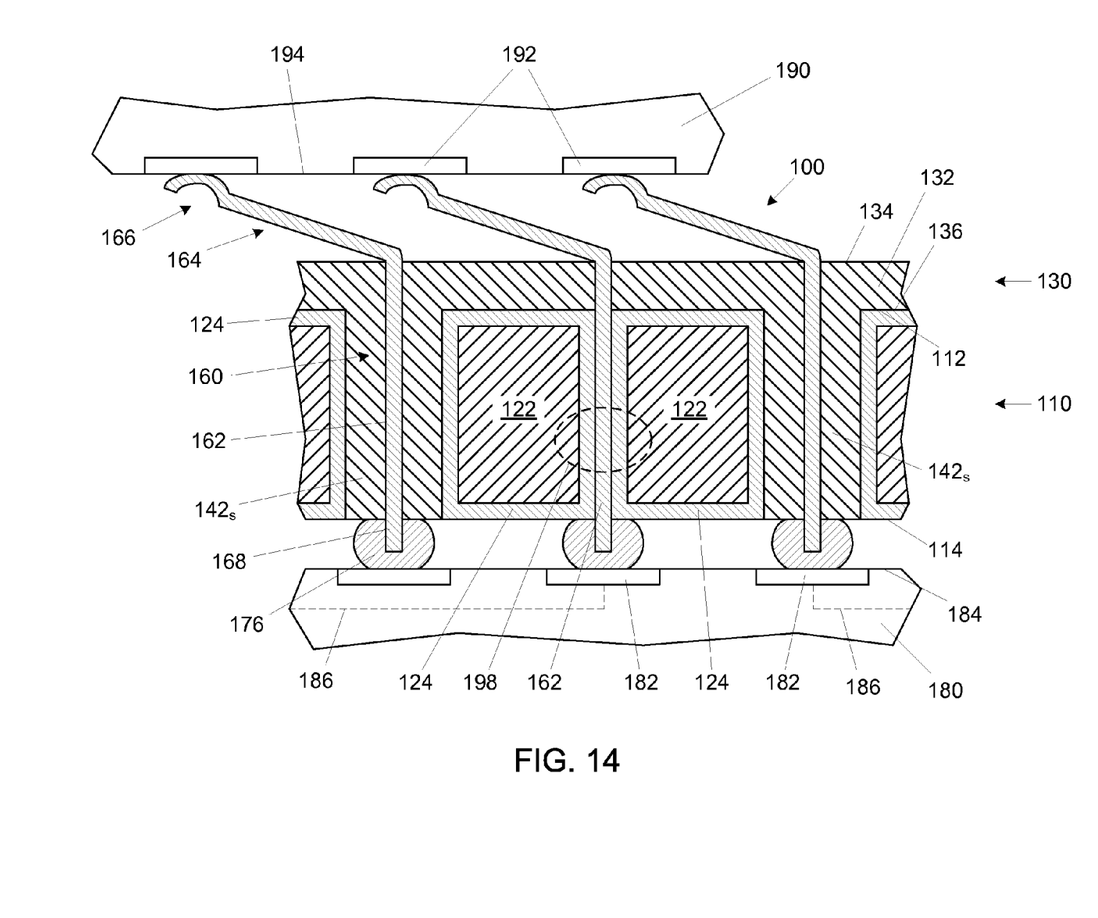

In another embodiment of the present description as illustrated in FIG. 14, the insulative insert projection $142_g$ for the contacts 160 used for grounding may be eliminated, wherein openings 116 (see FIGS. 1 and 2) that correspond to the contacts 160 used for grounding may be formed such that the contact 160 makes direct electric contact with the conductive socket substrate 110, as emphasized with dashed circle 198. It is understood that this embodiment will also eliminate the need for the first conductive material 172 (see FIG. 11) and the second conductive material 174 (see FIG. 11).

The embodiments of the present description may have numerous advantages, which may include, but are not limited to, simple plating for the fabrication of the conductive socket substrate 110 requiring no selective plating or solder masking and requiring little control in terms of plating thickness; insulation is provided by a fabricated component rather than from processing steps; utilizes current manufacturing techniques and equipment; provides flexibility in the materials used in forming the components; improves tolerances, as the insulative insert 130 controls the pitch tolerances between adjacent contacts 160, as well as microelectronic device 190 to contact 160 tolerances, rather than being controlled by the conductive socket substrate 110; and the interstitial seating plane and datum wall can be integrated into the insulative insert 130, as will be understood to those skilled in the art.

Figure 15:
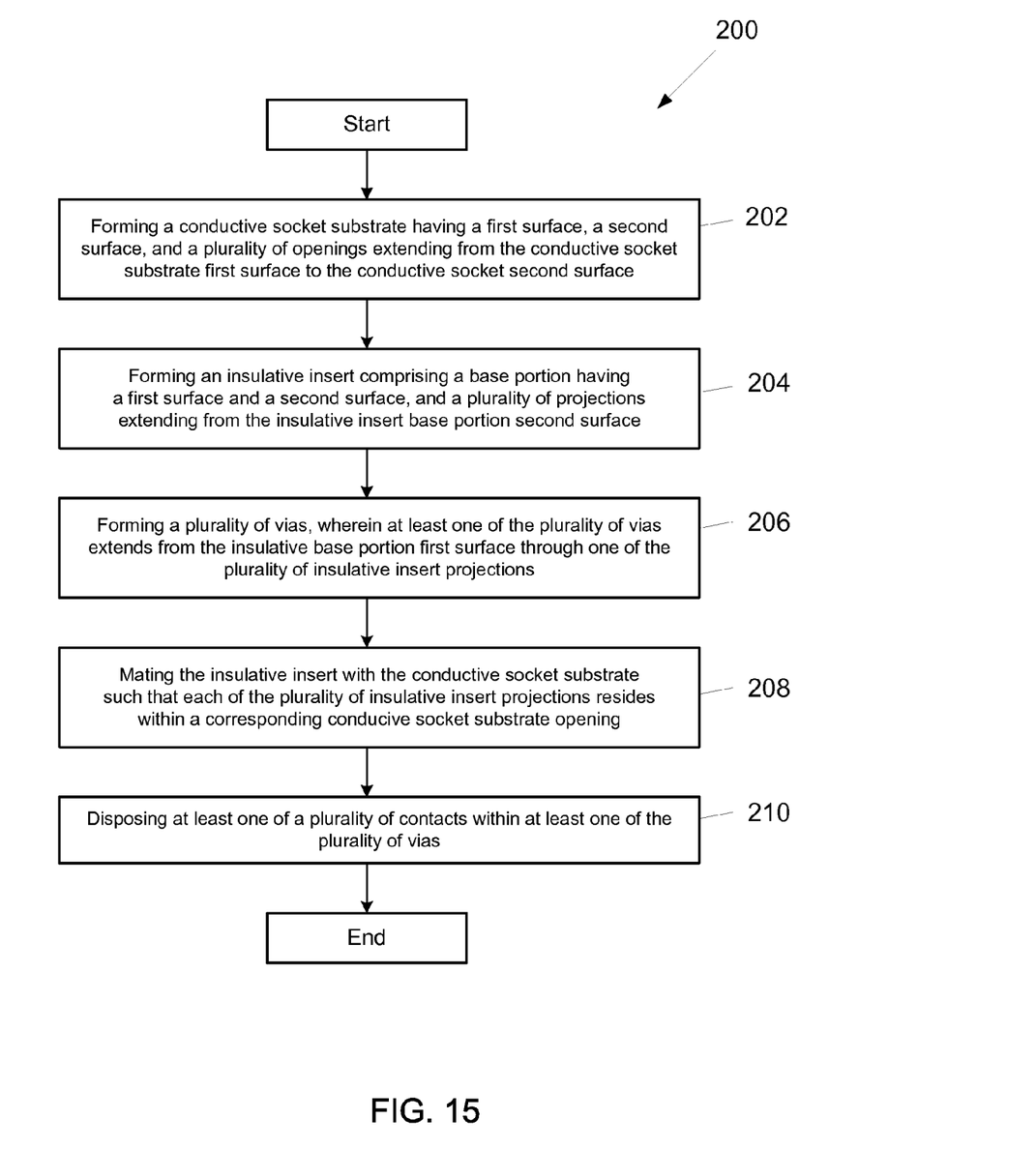
FIG. 15 is a flow chart of a process of fabricating a microelectronic socket, according to an embodiment of the present description.

FIG. 15 is a flow chart of a method 200 of fabricating a microelectronic socket according to an embodiment of the present description. As set forth in block 202, a conductive socket substrate may be formed having a first surface, a second surface, and a plurality of openings extending from the conductive socket substrate first surface to the conductive socket second surface. An insulative insert may be formed comprising a base portion having a first surface and a second surface, and a plurality of projections extending from the insulative insert base portion second surface, as set forth in block 204. As set forth in block 206, a plurality of vias may be formed, wherein at least one of the plurality of vias extends from the insulative base portion first surface through one of the plurality of insulative insert projections. The insulative insert may be mated with the conductive socket substrate such that the at least one insulative insert projection resides within a corresponding conductive socket substrate opening, as set forth in block 208. As set forth in block 210, at least one of a plurality of contacts may be disposed within at least one of the plurality of vias.

Figure 16:
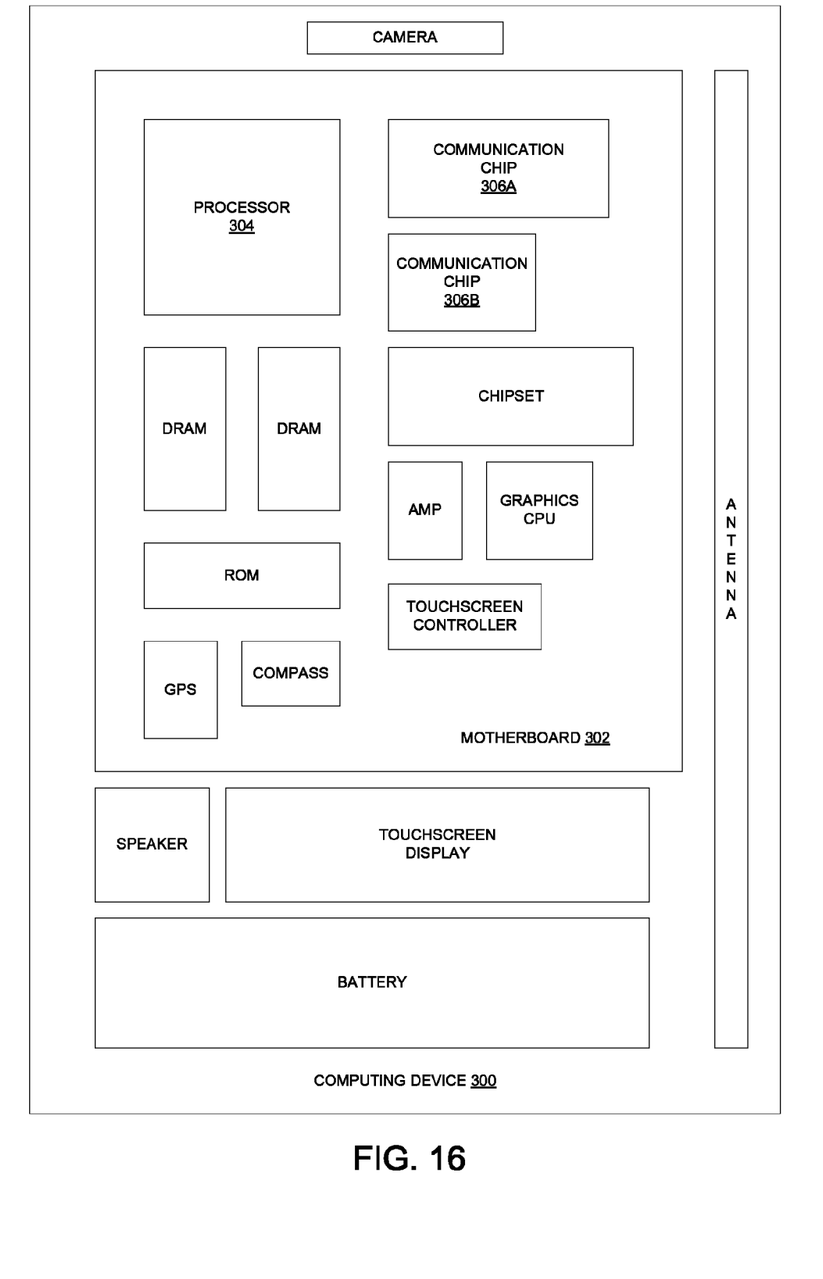
FIG. 16 illustrates a computing device in accordance with one implementation of the present description.

FIG. 16 illustrates a computing device 300 in accordance with one implementation of the present description. The computing device 300 houses a board 302. The board 302 may include a number of components, including but not limited to a processor 304 and at least one communication chip 306A, 306B. In some implementations, the processor 304 may be physically and electrically coupled to the board 302 with a socket according to embodiments of the present description. In some implementations, the at least one communication chip 306A, 306B may also be physically and electrically coupled to the board 302 with a socket according to embodiments of the present description. In further implementations, the communication chip 306A, 306B is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306A, 306B enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306A, 306B. For instance, a first communication chip 306A may be dedicated to shorter range wireless communications such as Wi-Fi and Bluetooth and a second communication chip 306B may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the present description, the integrated circuit die of the processor may be connected to other devices. The term "processor" may refer to any device or portion of a device that processes electronic data from registers and/or memory to transform that electronic data into other electronic data that may be stored in registers and/or memory.

The communication chip 306A, 306B also includes an integrated circuit die packaged within the communication chip 306A, 306B. In accordance with another implementation of the present description, the integrated circuit die of the communication chip may be connected to other devices.

In further implementations, another component housed within the computing device 300 may contain an integrated circuit die that includes an interconnect in accordance with embodiments of the present description.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-16. The subject matter may be applied to other microelectronic devices and assembly applications, as well as any appropriate electronic application, as will be understood to those skilled in the art.

The following examples pertain to further embodiments. Specifics in the examples may be used anywhere in one or more embodiments.

In Example 1, a microelectronic socket may comprise a conductive socket substrate having a first surface, a second surface, and a plurality of openings extending from the conductive socket substrate first surface to the conductive socket second surface; an insulative insert comprising a base portion having a first surface and a second surface, and a plurality of projections extending from the insulative insert base portion second surface, wherein the insulative insert is mated with the conductive socket substrate such that each of the plurality of insulative insert projections resides within a corresponding conductive socket substrate opening; a plurality of vias, wherein at least one of the plurality of vias extends from the insulative base portion first surface through one of the plurality of insulative insert projections; and a plurality of contacts, wherein at least one of the plurality of contacts resides within at least one of the plurality of vias.

In Example 2, the subject matter of Example 1 can optionally include the conductive socket substrate comprising a core plated with a conductive material.

In Example 3, the subject matter of any of Examples 1 to 2 can optionally include the insulative insert base portion second surface contacting the conductive socket substrate first surface.

In Example 4, the subject matter of any of Examples 1 to 3 can optionally include at least one of the plurality of contacts in electrical contact with the conductive socket substrate.

In Example 5, the subject matter of any of Examples 1 to 4 can optionally include one of the plurality of vias including a slotted portion which provides an opening between the slotted portion and the insulative insert second surface, and further comprising a first conductive material disposed within the slotted portion to form an electrical connection between one of the contacts and the conductive socket substrate.

In Example 6, the subject matter of any of Examples 1 to 5 can optionally include the conductive socket substrate having a thickness defined between the conductive socket first surface and the conductive socket second surface.

In Example 7, the subject matter of any of Example 6 can optionally include at least one of the plurality of insulative insert projections having a height substantially equal to the conductive socket substrate thickness.

In Example 8, the subject matter of Example 6 can optionally include at least one of the plurality of insulative insert projections having a height less than the conductive socket substrate thickness defining a recess, and further comprising a second conductive material disposed within the recess to form an electrical connection between one of the contacts and the conductive socket substrate.

In Example 9, the subject matter of any of Examples 1 to 8 can optionally include a plurality of interconnects, wherein each of the plurality of interconnects is attached to a corresponding contact.

In Example 10, the subject matter of any of Examples 1 to 9 can optionally include the at least one contact comprises a cantilever contact.

In Example 11, the subject matter of Example 10 can optionally include the cantilever contact comprises a contact body disposed within the via of the at least one insulative insert projection and a spring cantilever portion extending over the insulative insert base portion first surface.

In Example 12, a method of forming a microelectronic socket may comprise forming a conductive socket substrate having a first surface, a second surface, and a plurality of openings extending from the conductive socket substrate first surface to the conductive socket second surface; forming an insulative insert comprising a base portion having a first surface and a second surface, and a plurality of projections extending from the insulative insert base portion second surface; forming a plurality of vias, wherein at least one of the plurality of vias extends from the insulative base portion first surface through one of the plurality of insulative insert projections; mating the insulative insert with the conductive socket substrate such that each of the plurality of insulative insert projections resides within a corresponding conductive socket substrate openings, and such that the insulative insert base portion second surface contacts the conductive socket substrate first surface; and disposing at least one of a plurality of contacts within at least one of the plurality of vias.

In Example 13, the subject matter of Example 12 can optionally include forming the conductive socket substrate comprising plating a core with a conductive material.

In Example 14, the subject matter of any of Examples 12 to 13 can optionally include disposing at least one of a plurality of contacts such that it is in electrical contact with the conductive socket substrate.

In Example 15, the subject matter of any of Examples 12 to 14 can optionally forming the plurality of vias comprising forming one of the plurality of vias to include a slotted portion which provides an opening between the slotted portion and the insulative insert second surface, and further comprising disposing a first conductive material within the slotted portion to form an electrical connection between one of the contacts and the conductive socket substrate.

In Example 16, the subject matter of Example 12 to 15 can optionally include forming the conductive socket substrate comprising forming the conductive socket substrate having a thickness defined between the conductive socket first surface and the conductive socket second surface, and wherein forming the plurality of insulative insert projections comprises forming at least one of the plurality of insulative insert projections having a height less than the conductive socket substrate thickness defining a recess, and further comprising disposing a second conductive material within the recess to form an electrical connection between one of the contacts and the conductive socket substrate.

In Example 17, a computing device may comprise a board; a microelectronic socket attached to the board; a microelectronic device biased to the microelectronic socket; and wherein the microelectronic socket comprises: a conductive socket substrate having a first surface, a second surface, and a plurality of openings extending from the conductive socket substrate first surface to the conductive socket second surface; an insulative insert comprising a base portion having a first surface and a second surface, and a plurality projections extending from the insulative insert base portion second surface, wherein the insulative insert is mated with the conductive socket substrate such that each of the plurality of insulative insert projections resides within a corresponding conductive socket substrate opening; a plurality of vias, wherein at least one of the plurality of vias extends from the insulative base portion first surface through one of the plurality of insulative insert projections; and a plurality of contacts, wherein at least one of the plurality of contacts resides within at least one of the plurality of vias.

In Example 18, the subject matter of Example 17 can optionally include the conductive socket substrate comprises a core plated with a conductive material.

In Example 19, the subject matter of any of Examples 17 to 18 can optionally include the insulative insert base portion second surface contacts the conductive socket substrate first surface.

In Example 20, the subject matter of any of Examples 17 to 19 can optionally include at least one of the plurality of contacts is in electrical contact with the conductive socket substrate.

In Example 21, the subject matter of any of Examples 17 to 20 can optionally include one of the plurality of vias includes a slotted portion which provides an opening between the slotted portion and the insulative insert second surface, and further comprising a first conductive material disposed within the slotted portion to form an electrical connection between one of the contacts and the conductive socket substrate.

In Example 22, the subject matter of any of Examples 17 to 21 can optionally include the conductive socket substrate having a thickness defined between the conductive socket first surface and the conductive socket second surface, and at least one of the plurality of insulative insert projections has a height substantially equal to the conductive socket substrate thickness.

In Example 23, the subject matter of any of Examples 17 to 21 can optionally include the conductive socket substrate having a thickness defined between the conductive socket first surface and the conductive socket second surface, and at least one of the plurality of insulative insert projections having a height less than the conductive socket substrate thickness defining a recess, and further comprising a second conductive material disposed within the recess to form an electrical connection between one of the contacts and the conductive socket substrate.

In Example 24, the subject matter of any of Examples 17 to 23 can optionally include a plurality of interconnects, wherein each of the plurality of interconnects is attached to a corresponding contact.

In Example 25, the subject matter of any of Examples 17 to 24 can optionally include the at least one contact comprising a cantilever contact.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic socket, comprising:
    a conductive socket substrate having a first surface, a second surface, and a plurality of openings extending from the conductive socket substrate first surface to the conductive socket second surface, wherein the conductive socket substrate comprises a non-conductive core and a conductive material on an exterior surface of the non-conductive core;
    an insulative insert comprising a base portion having a first surface and a second surface, and a plurality of projections extending from the insulative insert base portion second surface, wherein the insulative insert is mated with the conductive socket substrate such that each of the plurality of insulative insert projections resides within a corresponding conductive socket substrate opening;
    a plurality of vias, wherein at least one of the plurality of vias extends from the insulative base portion first surface through one of the plurality of insulative insert projections;
    a plurality of contacts, wherein at least one of the plurality of contacts resides within at least one of the plurality of vias; and
    wherein the conductive socket substrate has a thickness defined between the conductive socket first surface and the conductive socket second surface and wherein at least one of the plurality of insulative insert projections has a height less than the conductive socket substrate thickness defining a recess, and further comprising a second conductive material disposed within the recess to form an electrical connection between one of the contacts and the conductive socket substrate.

2. The microelectronic socket of claim 1, wherein the insulative insert base portion second surface contacts the conductive socket substrate first surface.

3. The microelectronic socket of claim 1, wherein at least one of the plurality of contacts is in electrical contact with the conductive socket substrate.

4. The microelectronic socket of claim 1, wherein one of the plurality of vias includes a slotted portion which provides an opening between the slotted portion and the insulative insert second surface, and further comprising a first conductive material disposed within the slotted portion to form a electrical connect between one of the contacts and the conductive socket substrate.

5. The microelectronic socket of claim 1, wherein at least one of the plurality of insulative insert projections has a height substantially equal to the conductive socket substrate thickness.

6. The microelectronic socket of claim 1, further including a plurality of interconnects, wherein each of the plurality of interconnects is attached to a corresponding contact.

7. The microelectronic socket of claim 1, wherein the at least one contact comprises a cantilever contact.

8. The microelectronic socket of claim 7, wherein the cantilever contact comprises a contact body disposed within the via of the at least one insulative insert projection and a spring cantilever portion extending over the insulative insert base portion first surface.

9. A method of fabricating a microelectronic socket, comprising:
    forming a conductive socket substrate comprising forming a plurality of openings in non-conductive substrate and plating a conductive material on the non-conductive substrate, such that the conductive socket has a first surface, a second surface, and a plurality of openings extending from the conductive socket substrate first surface to the conductive socket second surface;
    forming an insulative insert comprising a base portion having a first surface and a second surface, and a plurality of projections extending from the insulative insert base portion second surface;
    forming a plurality of vias, wherein at least one of the plurality of vias extends from the insulative base portion first surface through one of the plurality of insulative insert projections;
    mating the insulative insert with the conductive socket substrate such that each of the plurality of insulative insert projections resides within a corresponding conductive socket substrate opening;

disposing at least one of a plurality of contacts within at least one of the plurality of vias; and wherein forming the conductive socket substrate comprises forming the conductive socket substrate having a thickness defined between the conductive socket first surface and the conductive socket second surface, and wherein forming the plurality of insulative insert projections comprises forming at least one of the plurality of insulative insert projections having a height less than the conductive socket substrate thickness defining a recess, and further comprising disposing a second conductive material within the recess to form an electrical connection between one of the contacts and the conductive socket substrate.

10. The method of claim 9, further including disposing at least one of the plurality of contacts such that it is in electrical contact with the conductive socket substrate.

11. The method of claim 9, wherein forming the plurality of vias comprises forming one of the plurality of vias to include a slotted portion which provides an opening between the slotted portion and the insulative insert second surface, and further comprising disposing a first conductive material within the slotted portion to form an electrical connection between one of the contacts and the conductive socket substrate.

12. A computing device, comprising:
a board;
a microelectronic socket attached to the board;
a microelectronic device biased to the microelectronic socket; and
wherein the microelectronic socket comprises:
a conductive socket substrate having a first surface, a second surface, and a plurality of openings extending from the conductive socket substrate first surface to the conductive socket second surface, wherein the conductive socket substrate comprises a non-conductive core and a conductive material on an exterior surface of the non-conductive core;
an insulative insert comprising a base portion having a first surface and a second surface, and a plurality of projections extending from the insulative insert base portion second surface, wherein the insulative insert is mated with the conductive socket substrate such that each of the plurality of insulative insert projections resides within a corresponding conductive socket substrate opening;
a plurality of vias, wherein at least one of the plurality of vias extends from the insulative base portion first surface through one of the plurality of insulative insert projections;
a plurality of contacts, wherein at least one of the plurality of contacts resides within at least one of the plurality of vias;
wherein the conductive socket substrate has a thickness defined between the conductive socket first surface and the conductive socket second surface and wherein at least one of the plurality of insulative insert projections has a height less than the conductive socket substrate thickness defining a recess, and further comprising a second conductive material disposed within the recess to form an electrical connection between one of the contacts and the conductive socket substrate.

13. The computing device of claim 12, wherein the insulative insert base portion second surface contacts the conductive socket substrate first surface.

14. The computing device of claim 12, wherein at least one of the plurality of contacts is in electrical contact with the conductive socket substrate.

15. The computing device of claim 12, wherein one of the plurality of vias includes a slotted portion which provides an opening between the slotted portion and the insulative insert second surface, and further comprising a first conductive material disposed within the slotted portion to form an electrical connection between one of the contacts and the conductive socket substrate.

16. The computing device of claim 12, wherein the conductive socket substrate has a thickness defined between the conductive socket first surface and the conductive socket second surface and wherein at least one of the plurality of insulative insert projections has a height substantially equal to the conductive socket substrate thickness.

17. The computing device of claim 12, further including a plurality of interconnects, wherein each of the plurality of interconnects is attached to a corresponding contact.

18. The computing device of claim 12, wherein the at least one contact comprises a cantilever contact.

* * * * *